(12) United States Patent
Kaller et al.

(10) Patent No.: US 8,870,396 B2
(45) Date of Patent: Oct. 28, 2014

(54) SUBSTRATES FOR MIRRORS FOR EUV LITHOGRAPHY AND THEIR PRODUCTION

(71) Applicant: Carl Zeiss SMT GmbH, Oberkochen (DE)

(72) Inventors: Julian Kaller, Koenigsbronn (DE); Wilfried Clauss, Tuebingen (DE); Michael Gerhard, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/667,862

(22) Filed: Nov. 2, 2012

(65) Prior Publication Data

US 2013/0120863 A1    May 16, 2013

Related U.S. Application Data

(63) Continuation of application No. PCT/EP2011/057074, filed on May 3, 2011.

(60) Provisional application No. 61/330,517, filed on May 3, 2010.

(30) Foreign Application Priority Data

May 3, 2010   (DE) .................. 10 2010 028 488

(51) Int. Cl.
| | |
|---|---|
| *G02B 5/08* | (2006.01) |
| *C03B 19/09* | (2006.01) |
| *C03B 19/06* | (2006.01) |
| *C03C 10/00* | (2006.01) |
| *G03F 7/20* | (2006.01) |
| *C03C 14/00* | (2006.01) |
| *C03C 3/06* | (2006.01) |

(52) U.S. Cl.
CPC .............. *G02B 5/08* (2013.01); *C03C 2201/42* (2013.01); *C03B 19/09* (2013.01); *C03B 19/06* (2013.01); *C03C 10/00* (2013.01); *G03F 7/70891* (2013.01); *C03C 14/00* (2013.01); *C03C 3/06* (2013.01)
USPC .......................................................... 359/838

(58) Field of Classification Search
CPC ........ G02B 5/08; G02B 1/00; G02B 2003/00; C03C 14/00; C03C 3/06
USPC .................................... 359/838; 501/4, 7, 32
See application file for complete search history.

(56) References Cited

U.S. PATENT DOCUMENTS

| | | | |
|---|---|---|---|
| 5,591,682 A | 1/1997 | Goto | |
| 7,220,690 B2 * | 5/2007 | Mitra et al. | ....... 501/4 |

(Continued)

FOREIGN PATENT DOCUMENTS

| | | |
|---|---|---|
| DE | 102004024808 A1 | 12/2005 |
| EP | 1321440 A2 | 12/2002 |

(Continued)

OTHER PUBLICATIONS

Davis M. J., et al. :"Thermal Expansion and internal quality of a proposed EUVL mask substrate material: Zerodur", SPIE, The International Society for Optical Engineering SPIE, USA, Nov. 11, 2001, pp. 100-106.

(Continued)

*Primary Examiner* — Euncha Cherry
(74) *Attorney, Agent, or Firm* — Edell, Shapiro & Finnan, LLC

(57) ABSTRACT

For the production of mirrors for EUV lithography, substrates are suggested having a mean relative thermal longitudinal expansion of no more than 10 ppb across a temperature difference ΔT of 15° C. and a zero-crossing temperature in the range between 20° C. and 40° C. For this purpose, at least one first and one second material having low thermal expansion coefficients and opposite gradients of the relative thermal expansion as a function of temperature are selected and a substrate is produced by mixing and bonding these materials.

19 Claims, 12 Drawing Sheets

(56) References Cited

U.S. PATENT DOCUMENTS

| | | |
|---|---|---|
| 2006/0179879 A1 | 8/2006 | Ellison et al. |
| 2007/0035814 A1 | 2/2007 | Dinger et al. |
| 2007/0246156 A1 | 10/2007 | Kohlmann et al. |
| 2008/0274869 A1 | 11/2008 | Englisch et al. |
| 2009/0143213 A1 | 6/2009 | Hrdina et al. |
| 2010/0028787 A1 | 2/2010 | Koike et al. |
| 2011/0052869 A1 | 3/2011 | Hrdina et al. |

FOREIGN PATENT DOCUMENTS

| | | |
|---|---|---|
| WO | 2005040925 A1 | 5/2005 |
| WO | 2009107869 A1 | 9/2009 |
| WO | 2011039159 A1 | 4/2011 |
| WO | 2011078414 A2 | 6/2011 |

OTHER PUBLICATIONS

Hrdina K. E. et al., :"Characterization and characteristics of a ULE(R) Glass tailored for EUVL needs", SPIE, vol. 4688, 2002, pp. 454-461.

Kushibiki J. et al., :"Evaluation of TiO2-SiO2 ultra-low-expansion glass fabricated by the soot method using the line-focus-beam ultrasonic material characterization system", SPIE, vol. 6921, Mar. 14, 2008, pp. 69213P-1-69213P-7.

Bentley, J., et al. :"Matter Matters—Optical materials rise to the microlithography challenge", SPIE O.E. magazine, Oct. 2003, pp. 26-28.

\* cited by examiner

SUBSTRATES FOR MIRRORS FOR EUV LITHOGRAPHY AND THEIR PRODUCTION

CROSS-REFERENCE TO RELATED APPLICATIONS

This is a Continuation of International Application PCT/EP2011/057074, with an international filing date of May 3, 2011, and the complete disclosure of which, including amendments, is incorporated into this application by reference.

FIELD OF AND BACKGROUND OF THE INVENTION

The present invention relates to substrates for mirrors for EUV lithography. Moreover, the present invention relates to substrates for mirrors for EUV lithography having an essentially periodic distribution of the thermal expansion coefficient. Furthermore, the present invention relates to a method for the production of a substrate for mirrors for EUV lithography, and to a mirror for EUV lithography.

To be able to produce ever finer structures in, for example, the production of semiconductor components with lithographic methods, light of an increasingly shorter wavelength is used. When working in the extreme ultraviolet (EUV) wavelength range, at a wavelength, in particular, between about 5 nm and 20 nm, it is no longer possible to work with lens-like elements in the transmission mode, rather exposure and projection objectives composed of reflective optical elements are constructed, having reflective coatings adapted to each working wavelength.

As a substrate material, in particular for reflective optical elements for EUV lithography, so-called zero-expansion materials are used, having a thermal expansion coefficient in the near zero range at temperatures present during lithography operation and at room temperature. Prime candidates are glass-ceramic materials and quartz glass doped with titanium. Cordierite, a mineral from the silicate class of minerals, can also be used, where the thermal expansion coefficient can be influenced by adding various additives. All three material classes can be produced in such a manner that, at a temperature dependent on the actual material used, the thermal expansion coefficient, here defined as a differential for the temperature of the relative longitudinal expansion as a function of the temperature, becomes equal to zero. This temperature is also called the zero-crossing temperature. With titanium-doped quartz glass and cordierite, the zero-crossing temperature can be influenced by the content of additives, in glass-ceramic materials by recrystallization processes in strictly controlled reheating cycles.

For use as a substrate material for mirrors for EUV lithography, care has to be taken that the thermal expansion is as small as possible in the temperature range between room temperature and the operating temperature during the lithography process. To be able to fulfill the imaging precision requirements desired for EUV lithography, among other things, the tolerances for the three-dimensional profile of the optically used surfaces of the mirrors are substantially smaller than, for example, in lithography using ultraviolet radiation.

OBJECTS AND SUMMARY OF THE INVENTION

It is an object of the present invention to improve already known substrates with respect to their usability as substrates for EUV mirrors.

According to a first aspect, the object is achieved by a substrate for mirrors for EUV lithography having a mean relative longitudinal thermal expansion of not more than 10 parts per billion (ppb) across a temperature interval $\Delta T$ of 15° C. and a zero-crossing temperature in the range between 20° C. and 40° C.

It has been found that substrates having such a thermal longitudinal expansion are well suited as substrates for mirrors for EUV lithography, wherein, under operating conditions at e.g. temperatures in the range between 20° C. and 40° C., the original dimensional fit has to be maintained with high precision to achieve the desired imaging properties. The operating conditions are determined, inter alia, by the absorption of EUV radiation in the mirror, which can lead to a high heat load. Substrates having such a mean relative thermal longitudinal expansion can be obtained, for example, by combining substrate materials whose thermal longitudinal expansions are at least partially mutually compensated.

In a preferred embodiment, the thermal longitudinal expansion is no more than 10 ppb across a temperature interval $\Delta T$ of 30° C. In a further preferred embodiment, the thermal longitudinal expansion is no more than 5 ppb across a temperature interval $\Delta T$ of 15° C. The above first embodiment is particularly suitable as a substrate for EUV mirrors having a particularly high heat load, as can be the case, in particular, for mirrors arranged to the front of the beam path, in particular in illumination systems. The substrate according to the above second embodiment is particularly well suited for mirrors that are part of the projection system of an EUV lithography apparatus. These mirrors are further back in the beam path and are thus exposed to a lower heat load. Since they are used directly for imaging structures on masks or reticles onto an element to be structured, the requirements as to the dimensional accuracy are particularly stringent.

Preferably, the substrate has a a zero-crossing temperature in the range between 28° C. and 33° C.

According to a second aspect, the object is achieved by a substrate for mirrors for EUV lithography having a volume of at least 3000 cm$^3$, wherein the zero-crossing temperature averaged across any particular partial volume of up to 10 cm$^3$ varies by less than 2° C. Substrates having such zero-crossing temperature homogeneity can be manufactured by crushing, mixing and renewed melting or sintering of blanks having low homogeneity. They are particularly well suited for mirrors for EUV lithography because they allow for large and in view of geometric dimensions still thermally very stable mirrors.

Preferably, the substrate has a mean relative thermal longitudinal expansion of no more than 10 ppb across a temperature interval $\Delta T$ of 15° C., more preferably of no more than 10 ppb across a temperature interval $\Delta T$ of 30° C., and most preferably of no more than 5 ppb across a temperature interval $\Delta T$ of 15° C.

Preferably, the substrate has an averaged zero-crossing temperature in the range between 20° C. and 40° C., more preferably in the range between 28° C. and 33° C.

In further aspects, the object is achieved by a substrate having an inhomogeneous distribution of the mean thermal expansion coefficient in the direction normal to the surface of the substrate. Here, the surface of the substrate refers to the surface of the substrate that is optically used by, for example, applying a reflective coating on this surface as it is further processed to a mirror. The inhomogeneity in the distribution of the mean thermal expansion coefficient in the direction normal to the surface of the substrate can be used to selectively adapt the substrate to the heat load to be expected during operation. For this purpose, for example, the substrate can be combined from two or more partial substrates having different thermal expansion coefficients, or different zero-crossing temperatures. It is also possible to cut the substrate with spatial inhomogeneities from a material blank to adapt it to the heat load to be expected. Advantageously, the substrate having an inhomogeneous distribution of the mean thermal expansion coefficient has a mean relative thermal longitudinal expansion or a homogeneous distribution of the zero-crossing temperature as described above.

In one of the further aspects, it has proven particularly advantageous for the zero-crossing temperature to decrease in the direction normal to the surface of the substrate as the distance from the surface increases. By adapting the distribution of the zero-crossing temperature to the temperature distribution in the substrate to be expected under operating conditions, undesirable thermal expansions can be particularly well avoided, which would otherwise have a deleterious effect on the optical properties of an EUV mirror comprising a substrate and a highly reflective coating. The profile of the zero-crossing temperature can be selected across the depth in such a way that it gradually decreases in a corresponding manner as the heat load becomes smaller with increasing depth. By means of this adaptation, a small deviation between the local operating temperature and the zero-crossing temperature applicable there, and thus as small a volume change as possible, can be achieved across a large depth range.

In another of the further aspects, the substrate comprises at least one material section of an extension of 1 centimeter or more having a higher zero-crossing temperature than the substrate material surrounding it. Advantageously, this material section is arranged at a position on the substrate at which a higher heat load is to be expected during EUV lithography than in surrounding areas. Particularly preferably, this material section with a higher zero-crossing temperature is arranged at the surface of the substrate so that the percentage of the EUV radiation impinging there, which is absorbed in overlying layers, such as reflective layers, as the case may be, causes as small a heat expansion as possible.

In a further variant of this aspect, a first material section extends across the entire surface of the substrate and is adjacent to a second material section having a lower zero-crossing temperature, also extending across the entire surface of the substrate, and such a substrate has a heating device. Such a substrate reacts like a kind of bimetal. In the range between the two different zero-crossing temperatures, in particular, the resulting deformations vary in a range of small relative thermal longitudinal expansions in the direction normal to the surface of the substrate as heat is introduced during EUV lithography. Advantageously, the heating device is arranged on the substrate surface opposite the surface on which the highest heat introduction is expected. This is often the optically used surface of the substrate. Such a heating device is useful on the one hand to compensate deformations caused by impinging EUV radiation during the EUV lithography process. On the other hand, selective deformation of the dimensional fit of the mirror can be caused to correct other detected imaging errors.

According to a fifth aspect, the object is achieved by a substrate for mirrors for EUV lithography having an essentially periodic distribution of the zero-crossing temperature, wherein the period length in the plane of the surface of the substrate is longer than in the direction normal to the surface. Here, the surface of the substrate, again, refers to the optically used surface of the substrate. Essentially periodic distributions of the zero-crossing temperature can occur with substrate materials manufactured using the direct deposition method, in particular. Particularly frequently they can occur with titanium-doped quartz glasses. Particularly pronounced periodic variations result using direct deposition methods, for example, wherein the resulting material blank is rotated relative to the deposition device. By cutting the substrate from the blank in such a manner that the period in the plane of the surface of the substrate is larger than in the direction normal to the surface, it can be achieved that the lateral distance between the maximum and minimum zero-crossing temperature in the substrate surface is as large as possible. This causes only long-wave dimensional fitting errors to be induced by any inhomogeneous thermal expansion, which are easier to correct with the aid of suitable manipulators than are shorter-wave dimensional fitting errors. At the same time, the effect can be used that in the depth below the mirror surface, the maximum and minimum zero-crossing temperatures are at a relatively short distance one below the other, so that the deformations caused by them at least partially mutually compensate each other.

According to a sixth aspect, the object is achieved by a substrate for mirrors for EUV lithography comprising at least two sections arranged one on top of the other, wherein both have an essentially periodic distribution of the zero-crossing temperature and the distribution of the zero-crossing temperatures of the one section is shifted by half a period length relative to the distribution of the zero-crossing temperatures of the other section. In this manner, the above described effect, that maxima and minima of the zero-crossing temperature in the direction normal to the surface of the substrate follow each other with as short a period length as possible, can be used to achieve the best possible compensation of the various thermal expansions in areas having higher and lower zero-crossing temperatures.

In particularly preferred embodiments, the substrates for mirrors for EUV lithography have a polishing layer on their surfaces. In particular when glass-ceramic materials are at least partially used as substrate materials, it can happen that the substrate surface has micro roughnesses that are so pronounced that they would propagate into a highly reflective EUV coating and would severely compromise the efficiency of this coating. By applying a polishing layer to the substrate surface composed of a material that is particularly suitable for polishing down to small micro roughnesses, the substrate surface can be finished so that the functionality of the reflective layer is influenced as little as possible by the substrate surface when it is further processed into a mirror by the application of a reflective layer.

According to a seventh aspect, the object is achieved by a method for the production of a substrate for mirrors for EUV lithography, which includes:
  selecting at least one first and one second material having low thermal expansion coefficients and different zero-crossing temperatures;
  mixing and bonding the materials;
  finishing the substrate.

Furthermore, the object is achieved by a method for the production of a substrate for mirrors for EUV lithography, which includes:
  crushing a material having a low thermal expansion coefficient;
  mixing and bonding the material;
  finishing the substrate.

These two methods are particularly suitable for producing substrates for mirrors for EUV lithography in a simple and cost-effective manner, having a volume of at least 3000 $cm^3$, where the zero-crossing temperature averaged across any particular partial volume of up to 10 $cm^3$ varies by less than 2° C. In the above mentioned first method, a desired mean zero-crossing temperature can be adjusted by selecting suitable materials and mixing ratios. If a material having a mean zero-crossing temperature in the desired range already exists, it can be homogenized with respect to the zero-crossing temperature using the second method.

Advantageously, materials are selected having a zero-crossing temperature in the range between 20° C. and 40° C., and a gradient of the relative thermal expansion as a function of the temperature with a value less than 10 ppb/K$^2$. Particularly preferably, titanium-doped quartz glasses are selected, wherein the resulting zero-crossing temperature can be influenced very selectively on the basis of the titanium content.

According to an eighth aspect, the object is achieved by a method for the production of a substrate for mirrors for EUV lithography having a mean relative thermal longitudinal expansion of no more than 10 ppb across a temperature interval $\Delta T$ of 15° C., which includes:
- selecting at least one first and one second material having low thermal expansion coefficients and opposite gradients of the thermal expansion as a function of temperature;
- mixing and bonding the materials;
- finishing the substrate.

It has been found that by selecting materials with thermal expansion coefficients with opposite signs, a composite material can be newly created whose relative thermal expansion is almost zero across a large temperature range. On average, the effects of the thermal expansion coefficients with opposite signs cancel each other out across the entire substrate. By crushing the materials prior to mixing, it can be ensured that the inhomogeneities across the entire substrate of a composite material are so small that they cannot result, for example, in undesirable roughnesses. By adjusting different mixing ratios across the thickness of the substrate, an inhomogeneous distribution of the mean thermal expansion coefficient in the direction normal to the surface of the substrate can be obtained.

Advantageously, materials are selected that have a zero-crossing temperature in the range between 20° C. and 40° C., and a gradient of the relative thermal expansion as a function of temperature at an absolute value of less than 10 ppb/K$^2$. Particularly preferably, titanium-doped quartz glasses are chosen on the one hand and glass-ceramic materials on the other. These two types of materials have opposed gradients of thermal expansion as a function of temperature. Through use of thorough mixing, a substrate can be produced in which the thermal expansions of the one and the other material at least partially cancel each other out.

To obtain a particularly flat profile of the relative longitudinal expansion as a function of temperature, materials are preferably chosen whose zero-crossing temperatures differ by less than 2° C. Particularly preferably, materials with the same zero-crossing temperature are mixed with each other.

A particularly flat profile of relative thermal longitudinal expansion as a function of temperature can be achieved by taking the different absolute values of the gradients of thermal longitudinal expansion as a function of temperature into consideration when determining the mixing ratio of the selected materials. If, for example, the gradient of thermal longitudinal expansion as a function of temperature of one material is greater than the gradient of the thermal longitudinal expansion of the material with a thermal expansion coefficient having the opposite sign, it is advantageous to add a greater percentage of the second material than of the first material.

Preferably, mixing and bonding the materials is by blending in a viscous state, in particular when titanium-doped quartz glasses are mixed with each other. If glass-ceramic materials are additionally or exclusively mixed, it can be particularly advantageous to grind the materials prior to mixing and to bond the mixture by sintering, so that influence can be taken on the zero-crossing temperature with controlled heat treatment.

According to a last aspect, the object is achieved by a mirror for EUV lithography comprising a substrate as described above, and a reflective layer. To achieve high reflectivity in the EUV wavelength range, the reflective layer is preferably a multilayer system. Multilayer systems are alternately applied layers of a material having a higher real part of the refractive index at the wavelength at which EUV lithography is carried out (also referred to as a spacer) and a material having a lower real part of the refractive index at the working wavelength (also referred to as an absorber), wherein an absorber-spacer pair forms a stack. The sequence of a plurality of stacks, essentially simulates a crystal wherein the lattice planes correspond to the absorber layers, on which Bragg reflection occurs. The thicknesses of the individual layers as well as of the repetitive stacks, can be constant across the entire multilayer system, or they can vary, depending on which reflection profile is to be achieved.

Mirrors having one of the substrates described here have the advantage, in particular, that thermal expansion caused by EUV radiation during the lithography process and the associated heat load on the individual mirrors can be kept at a particularly low level so that there is no negative effect on the optical function of the mirrors.

The above and further features can be derived from the description and the drawings as well as from the claims, wherein the individual features can be realized alone or in combination in the form of subcombinations in an embodiment of the invention and also in different fields, and can represent advantageous embodiments as well as embodiments subject to patent protection in their own right.

BRIEF DESCRIPTION OF THE DRAWINGS

The present invention will be described in more detail with reference to advantageous embodiments, wherein.

DETAILED DESCRIPTION OF EXEMPLARY EMBODIMENTS

Figure 1A:
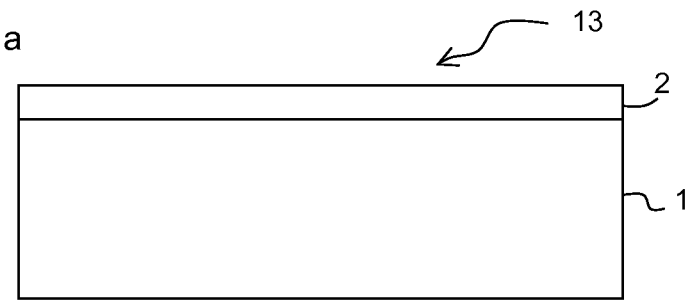
FIGS. 1*a-c* schematically show three embodiments of the substrate.

FIG. 1a schematically shows a substrate 1 for an optical element of a zero-expansion material on the basis of glass-ceramic material, titanium-doped quartz glass or cordierite. Glass-ceramic materials have crystals of an extension of usually less than 100 nm in a glass matrix. In certain temperature ranges, these crystals contract, while the glass matrix simultaneously expands. These two effects cancel each other out so that the thermal expansion coefficient of the glass-ceramic materials is essentially zero in this temperature range. When they are polished to obtain a dimensionally accurate fit for use as a component of a reflective optical element, there is, however, the problem that material is removed differently from the crystals than from the glass matrix. Titanium-doped quartz glass is better suited for polishing, however.

To reduce roughness, a polishing layer 2 is provided on substrate 1. In the example shown here, polishing layer 2 is based on quartz glass, which can be polished as an extremely homogeneous, highly viscous liquid on very small roughnesses even on a longitudinal scale from 1 mm to 10 nm. Apart from silicon dioxide, other materials well suited for polishing can also be used.

Prior to the application of polishing layer 2 on surface 13 of substrate 1, it is brought as close as possible to the desired final shape. Polishing layer 2 can be applied using the usual coating methods, such as chemical vapor deposition (CVD) methods, in particular plasma-based CVD methods, or physical vapor deposition (PVD) methods, in particular ion-based PVD methods. Sol-gel methods are also possible, in particular, with a cover layer on the basis of quartz glass. If necessary, the polishing layer is polished onto the desired roughness. Any shape corrections to achieve the desired dimensionally accurate fit can be carried out, for example, with ion beam figuring (IBF) methods.

Figure 1B:
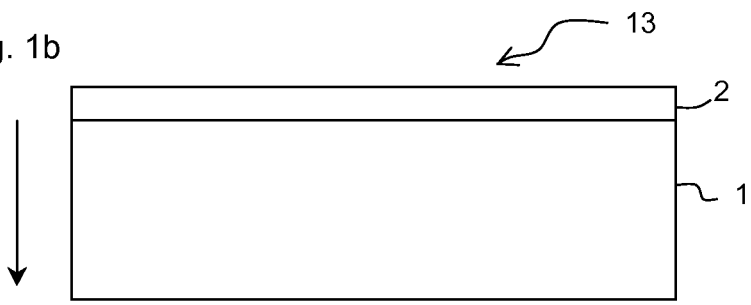

A first variant of the substrate shown in FIG. 1a is schematically shown in FIG. 1b. This substrate 1 has an inhomogeneous distribution of the mean thermal expansion coefficient in the direction normal to surface 13, shown by the arrow. In the example shown here, the zero-crossing temperature decreases in the direction normal to surface 13 of the substrate as the distance from surface 13 increases. Thereby, the distribution of the zero-crossing temperature is adapted to the temperature distribution to be expected under operating conditions to avoid undesirable thermal expansions.

Figure 1C:
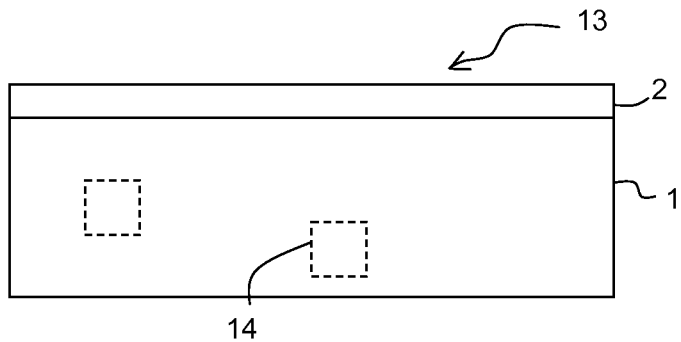

FIG. 1c schematically shows a further variant of a substrate 1 for mirrors for EUV lithography. Substrate 1 has a volume of more than 3000 $cm^3$, wherein the zero-crossing temperature averaged across any particular partial volume 14 of a volume of up to 10 $cm^3$ varies about each average value by less than 2° C. Incidentally, the variant shown in FIG. 1c of a substrate 1 can also exhibit a slightly decreasing mean zero-crossing temperature as the distance from surface 13 increases.

Figure 2:
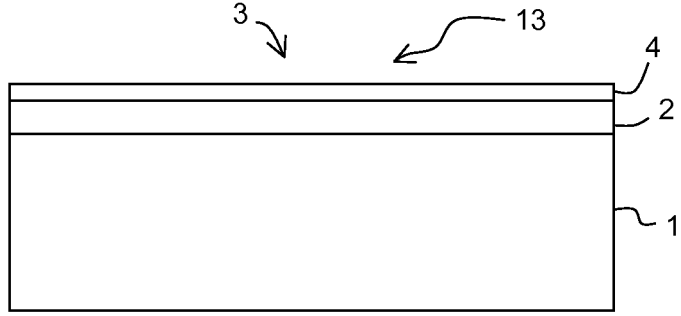
FIG. 2 schematically shows an embodiment of an EUV mirror.

FIG. 2 schematically shows an example of a mirror 3 comprising a reflective layer 4 on a substrate 1 with a polishing layer 2. In particular with mirrors for EUV lithography, reflective layer 4 consists of multilayer systems of alternating layers of materials having different real parts of the complex refractive index, essentially simulating a crystal with lattice planes, on which Bragg diffraction occurs.

Figure 3:
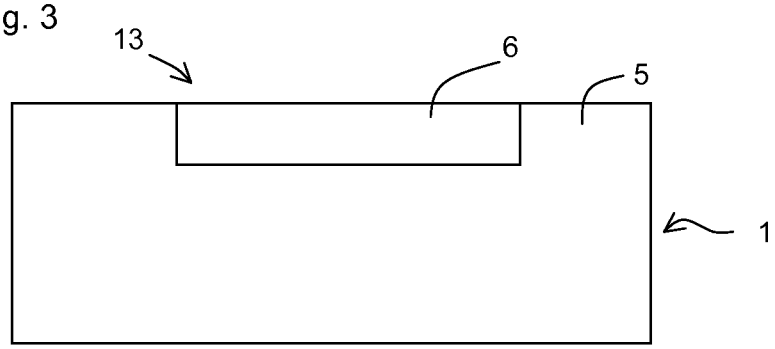
FIG. 3 schematically shows a fourth embodiment of a substrate.

In the exemplary embodiment shown in FIG. 3 of a substrate 1, in the surface of substrate 1 on which a polishing layer and a highly reflective layer are applied, as the case may be, during further processing to an EUV mirror, a material section 6 is inserted having an extension preferably slightly larger than the surface that would be illuminated by an EUV beam in an EUV lithography apparatus. This material section 6 has a higher zero-crossing temperature than the surrounding substrate material 5. It can thereby be taken into consideration that the substrate is not homogeneously heated during its use as an EUV mirror, but that heat is introduced into the material in particular in those places where the EUV radiation impinges on the EUV mirror. The other areas are however heated less. By adapting the distribution of the zero-crossing temperature to the heat distribution in the substrate material it can be ensured that the entire thermal expansion of the substrate is minimized. It can thus be achieved that the optical imaging properties of EUV mirrors made of such a substrate are negatively influenced as little as possible.

Figure 4:
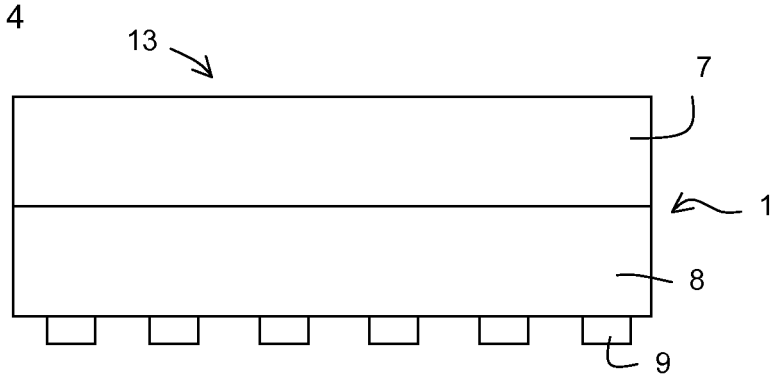
FIG. 4 schematically shows a fifth embodiment of a substrate.

In the embodiment shown in FIG. 4 of a substrate 1, a first material section 7 is provided extending over the entire surface of substrate 1 and arranged adjacent to a second material section 8 also extending across the entire surface of substrate 1. In the example shown here, material section 7 has a higher zero-crossing temperature than material section 8. As in the exemplary embodiment described with reference to FIG. 3, in the exemplary embodiment shown in FIG. 4, material section 7 having the higher zero-crossing temperature is arranged on that side of substrate 1 on which a reflective layer is to be applied as it is further processed to manufacture an EUV mirror and which will thus be exposed to a greater heat load.

Figure 5:
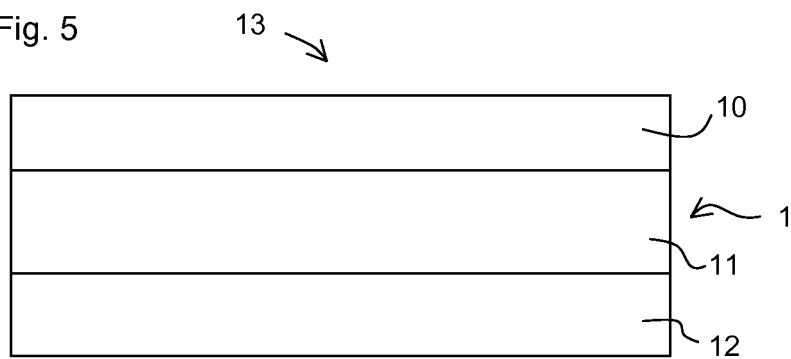
FIG. 5 schematically shows a sixth embodiment of a substrate.

To also take into consideration larger temperature differences within a substrate 1, the substrate can also be subdivided into three or more material sections having different zero-crossing temperatures. In the example shown in FIG. 5, substrate 1 is subdivided into three material sections 10, 11, 12, all three extending across the entire surface of the substrate. In the example shown here, material section 10 has a higher zero-crossing temperature, material section 11 has a moderate zero-crossing temperature, and section 12 has a low zero-crossing temperature so that the zero-crossing temperature successively decreases in the direction normal to the substrate 1, in which material section 10 is arranged. In a further modification, material sections can be provided not extending across the entire surface.

In the variant of the substrate shown in FIG. 4, having two material sections 7 and 8, a special feature is that the substrate 1 thus structured behaves in an analogous fashion to a bimetal when heat is introduced. The magnitude of the deformation can be controlled by the temperature, wherein the temperature range that one wants to use for control is determined by the differences in the zero-crossing temperature of the two material sections 7, 8. To be able to use this bimetal effect to the best advantage, in the embodiment according to FIG. 4, a heating device 9 is provided on the surface opposite the optically used side. In the example shown here, heating device 9 is composed of a plurality of individual heating elements. By locally heating material section 8 it is possible not only to compensate bending of the substrate used as a mirror due to the heat load, but also to selectively adjust, for example, astigmatic or comatic bending. Particularly high precision can be achieved when the temperature of the heating element is continuously controlled in dependence on the heat introduced during the EUV lithography operation.

Figure 6:
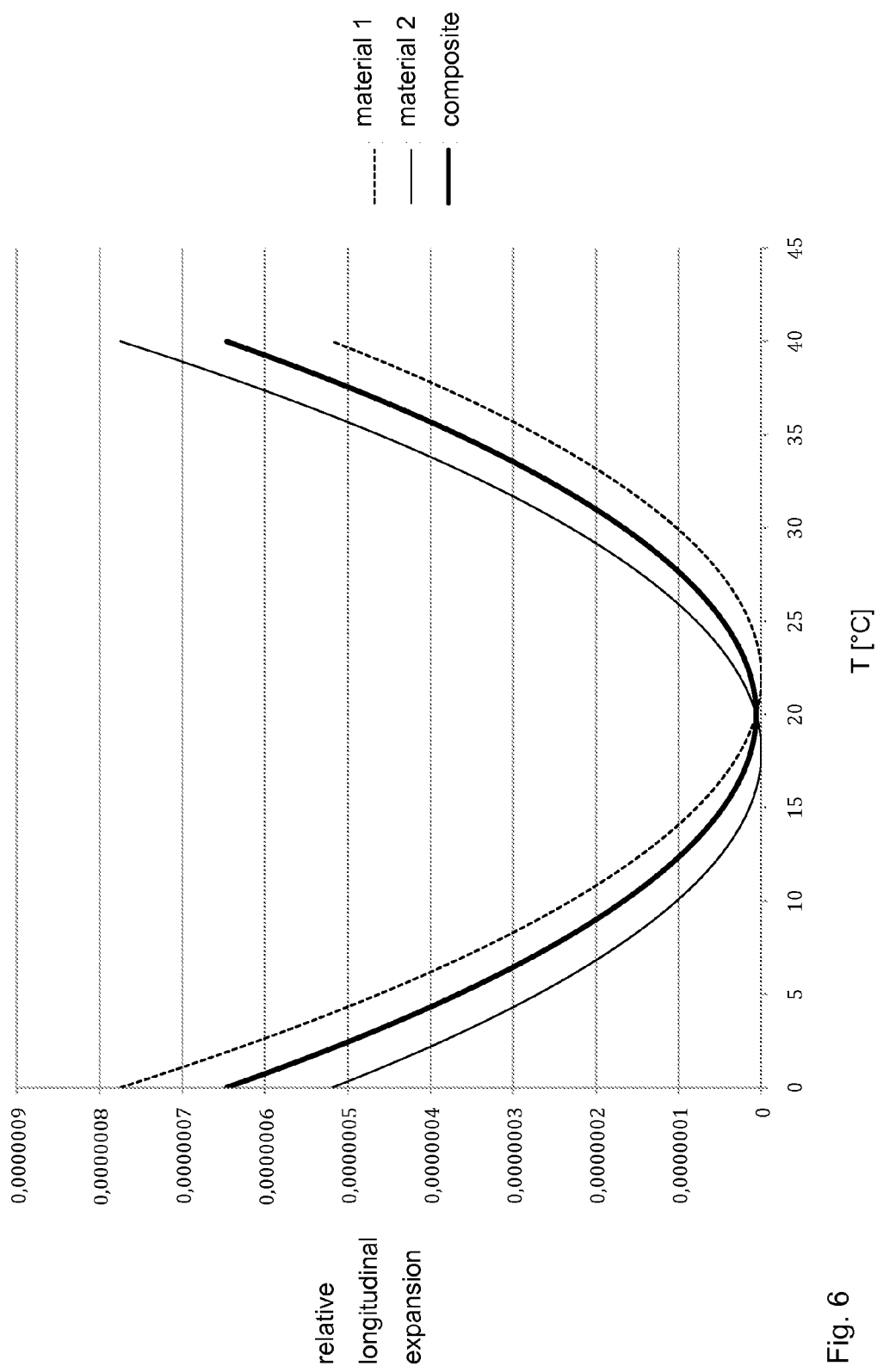
FIG. 6 shows thermal expansion as a function of temperature for an embodiment of the substrate according to FIG. 4.

The temperature behavior of the embodiment shown in FIG. 4 is shown in FIG. 6 in an exemplary manner. Lower material section 8 has a zero-crossing temperature of 22° C. and top material section 7 has a zero-crossing temperature of 24° C. Both material sections 7, 8 are fixedly connected to each other by means of wringing. The result is an average thermal longitudinal expansion plotted as a medium grey curve. With an increase in temperature from 18° C. to 20° C., the material of material section 8 is extended by 5 ppb and the material of the top material section 7 is shortened by 5 ppb. Depending on the size of the mirror and the thickness of the individual material sections 7, 8, this results in bending of the mirror in the nanometer range, which also results in a change in the focal length.

Figure 7:
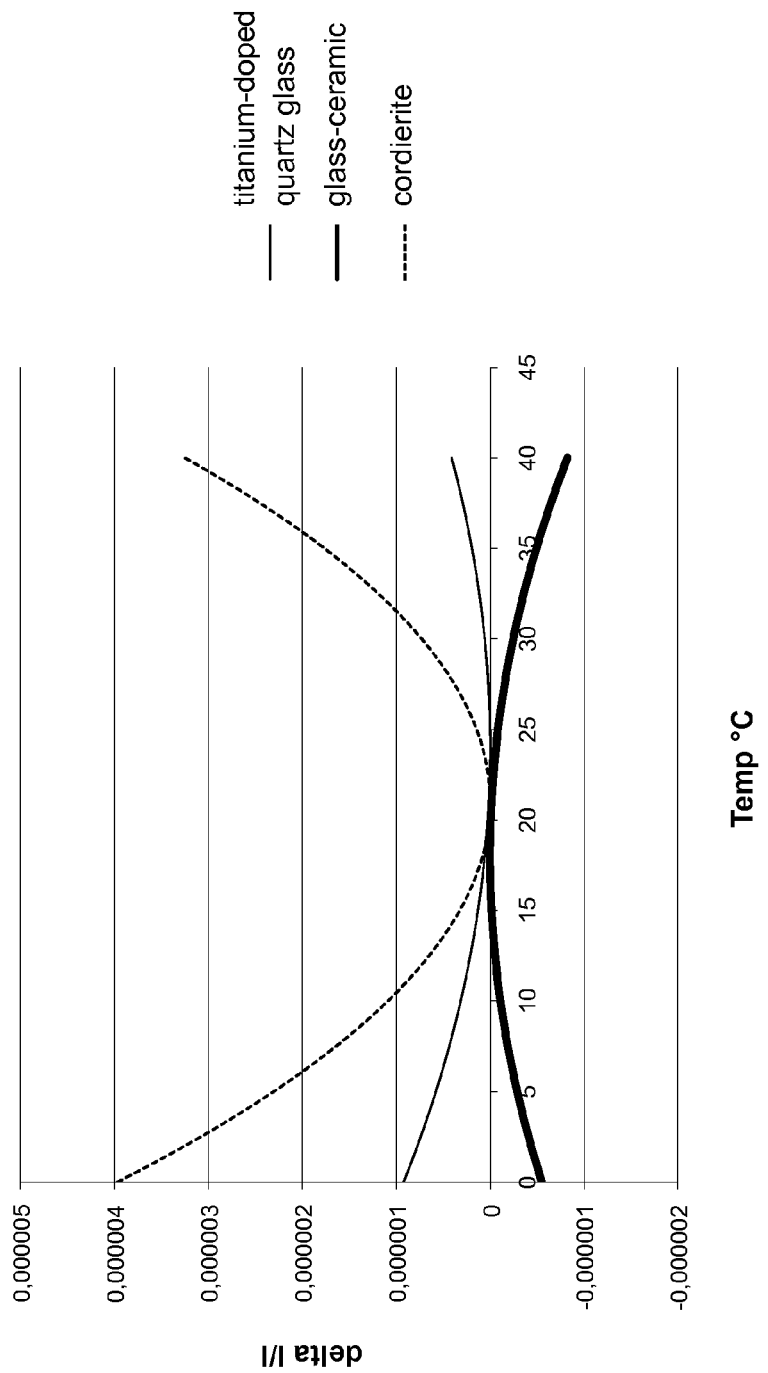
FIG. 7 shows the typical development of heat expansion as a function of temperature for various types of substrate materials.

In all embodiments of a substrate described so far, the material can be based on titanium-doped quartz glass, glass-ceramic material or cordierite. The characteristic profile of the relative longitudinal expansion as a function of time is shown in FIG. 7 for a titanium-doped quartz glass, a glass-ceramic material and a cordierite. For example, in FIG. 7, the titanium-doped quartz glass has a zero-crossing temperature of 24° C., the glass-ceramic material has a zero-crossing temperature of 18° C., and the cordierite has a zero-crossing temperature of 21° C. Both the titanium-doped quartz glass and the cordierite show a longitudinal expansion at other temperatures than the zero-crossing temperature, while the glass-ceramic material exhibits a shrinking behavior. However, the gradient is much steeper with cordierite than with the glass-ceramic material or the titanium-doped quartz glass.

Figure 16:
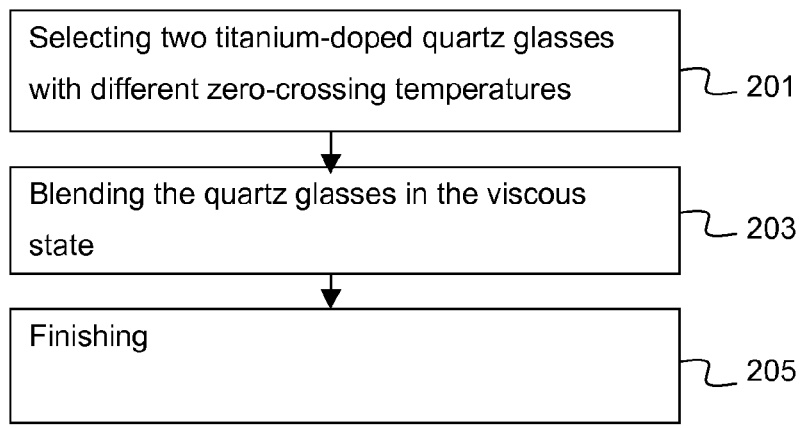
FIG. 16 shows a second embodiment of a method for the manufacture of substrates for EUV mirrors.

From these commercially available substrate materials, with substrate base materials, in particular on the basis of glass-ceramic materials and titanium-doped quartz glass, also cordierite, as the case may be, substrate materials can be created that are particularly well suited to the requirements for use as EUV mirrors. Titanium-doped quartz glass, for example, can be cheaply manufactured in the well known manner with the usual tolerances with respect to the zero-crossing temperature. The zero-crossing temperature is subsequently measured on the material blanks in a location-dependent manner. With titanium-doped quartz glass, for example, the zero-crossing temperature primarily depends on the titanium content, which can be measured, for example, with x-ray fluorescence analysis or indirectly by measuring sound velocities within the solid body. After measuring the zero-crossing temperatures of the individual material samples and their distribution, samples with different zero-crossing temperatures are selected such that, after mixing, the average value of the zero-crossing temperature corresponds to the desired zero-crossing temperature for each substrate, as schematically shown in step 201 of FIG. 16. Subsequently, the individual material samples are mixed, so that a homogeneous body having the desired zero-crossing temperature is created. This can be done, for example, by pounding or grinding the material samples into small particles and subsequent sintering. Preferably, the small material particles are blended in a hot state and thus a low-viscosity state (cf. step 203 in FIG. 16) in order to mix them in a particularly homogeneous manner. Subsequently, the substrate is finished (step 205 in FIG. 16) for example by cutting and polishing to final shape, coating with a polishing layer and the like.

Figure 8:
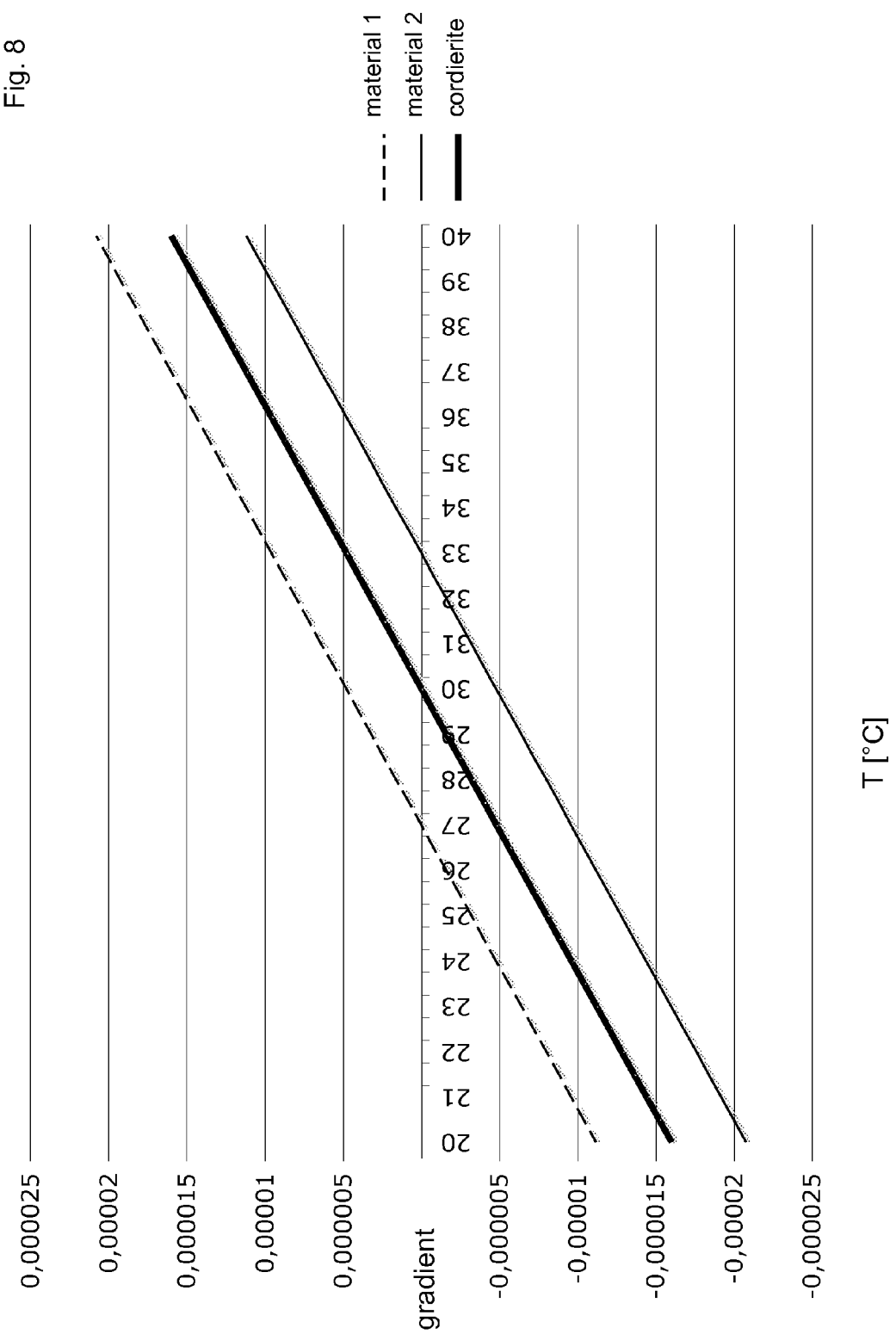
FIG. 8 shows the thermal expansion as a function of temperature for two different substrate materials and for a substrate composite material manufactured therefrom.

If two or more titanium-doped quartz glasses are mixed with each other, they have the same gradient of the relative thermal longitudinal expansion in a first approximation, which is about 1.6 ppb/K$^2$ in the case of titanium-doped quartz glasses. In FIG. 8, the first derivatives of the relative thermal longitudinal expansions in ppb/K are shown for two base materials, material 1 and material 2. The titanium-doped quartz glass material 1 has a zero-crossing temperature of 27° C., and the titanium-doped quartz glass material 2 has a zero-crossing temperature of 33° C. These two materials were thoroughly mixed and melted at a ratio of 1:1. The resulting composite material is a titanium-doped quartz glass having a zero-crossing temperature of 30° C., which also has high homogeneity of the zero-crossing temperature across the entire volume.

Figure 15:
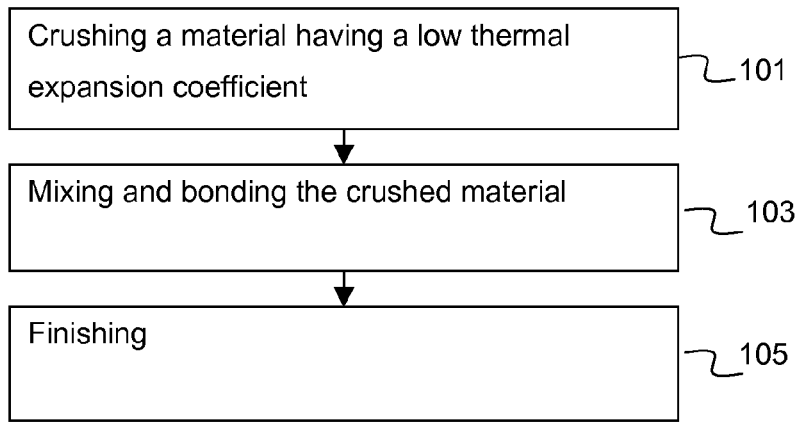
FIG. 15 shows a first embodiment of a method for the manufacture of substrates for EUV mirrors.

If a material with the desired average zero-crossing temperature already exists, which is too inhomogeneous, however, to serve as a substrate material for EUV mirrors, this material can be crushed (cf. FIG. 15, step 101). The degree of crushing is determined, in particular, by the desired degree of homogeneity. The material, for example, ground or pounded, is mixed and bonded, for example, by means of melting or sintering (step 103 in FIG. 15). Subsequently, the substrate can be finished (step 105 in FIG. 15). Glass-ceramic material or cordierite is suitable as well as titanium-doped quartz glass. In particular, substrates having a volume of at least 3000 cm$^3$ can be produced, in which the zero-crossing temperature averaged across any particular partial volume of up to 10 cm$^3$ varies by less than 2° C.

In a further development of this method, not only is it possible to produce substrate materials with a precisely tailored zero-crossing temperature, but in particular also substrates with an extremely flat profile of the thermal longitudinal expansion as a function of temperature. For this purpose, at least one first and one second material having low thermal expansion coefficients and opposite gradients of the thermal expansion coefficient are chosen. Titanium-doped quartz glass on the one hand and glass-ceramic materials on the other are particularly suitable for this (cf. step 301 in FIG. 17). These at least two materials are crushed, for example, by means of grinding, and then mixed. Subsequently, they are sintered (step 303 in FIG. 17) wherein the sintering process is adapted to the requirements of the added glass-ceramic particles, since the heat behavior can be influenced by means of the heat treatment in the case of glass-ceramic material. Subsequently, the material blank is finished to a substrate (step 305 in FIG. 17).

By choosing two materials, one of which exhibits an expansion in the range of the zero-crossing temperature and the other of which exhibits a shrinkage, a composite material can be created in which these two opposite effects partially cancel each other out so that substrates for mirrors for EUV lithography can be produced, which have an average relative thermal longitudinal expansion of no more than 10 ppb across a temperature difference ΔT of 15° C. By further optimizing the material mixture, depending on the demands put on the EUV mirror to be made from the substrate, a substrate can be created that has a thermal longitudinal expansion of no more than 10 ppb across a temperature difference ΔT of 30° C., or even has a thermal longitudinal expansion of no more than 5 ppb across a temperature difference ΔT of 15° C. By these means, for example, the thermal longitudinal expansion can be further reduced across a larger temperature range by having the zero-crossing temperatures of the materials chosen not differing excessively, preferably they differ by less than 2° C., particularly preferably, materials having the same zero-crossing temperature are selected. Alternatively or additionally, the different values of the gradients of the thermal expansion coefficients can be taken into consideration when choosing the mixing ratio of the selected materials.

It is known, for example, that glass-ceramic material, at temperatures surrounding its zero-crossing temperature, has a gradient of the relative thermal expansion as a function of temperature of about $-1.7$ ppb/K$^2$, while with titanium-doped quartz glass it is about $+1.6$ ppb/K$^2$. If titanium-doped quartz glass and glass-ceramic material with the same zero-crossing temperature are selected and mixed at a ratio of 1:1, a composite is obtained that has a relative thermal expansion of nearly zero across a large temperature range. Only deviations from the linear behavior of the gradient of the relative thermal expansion as a function of temperature are effective, so that the material does not change its length across a large temperature range. The deviations from the linear behavior can be additionally reduced by taking the value of the gradients into consideration when determining the mixing ratio.

Figure 9:
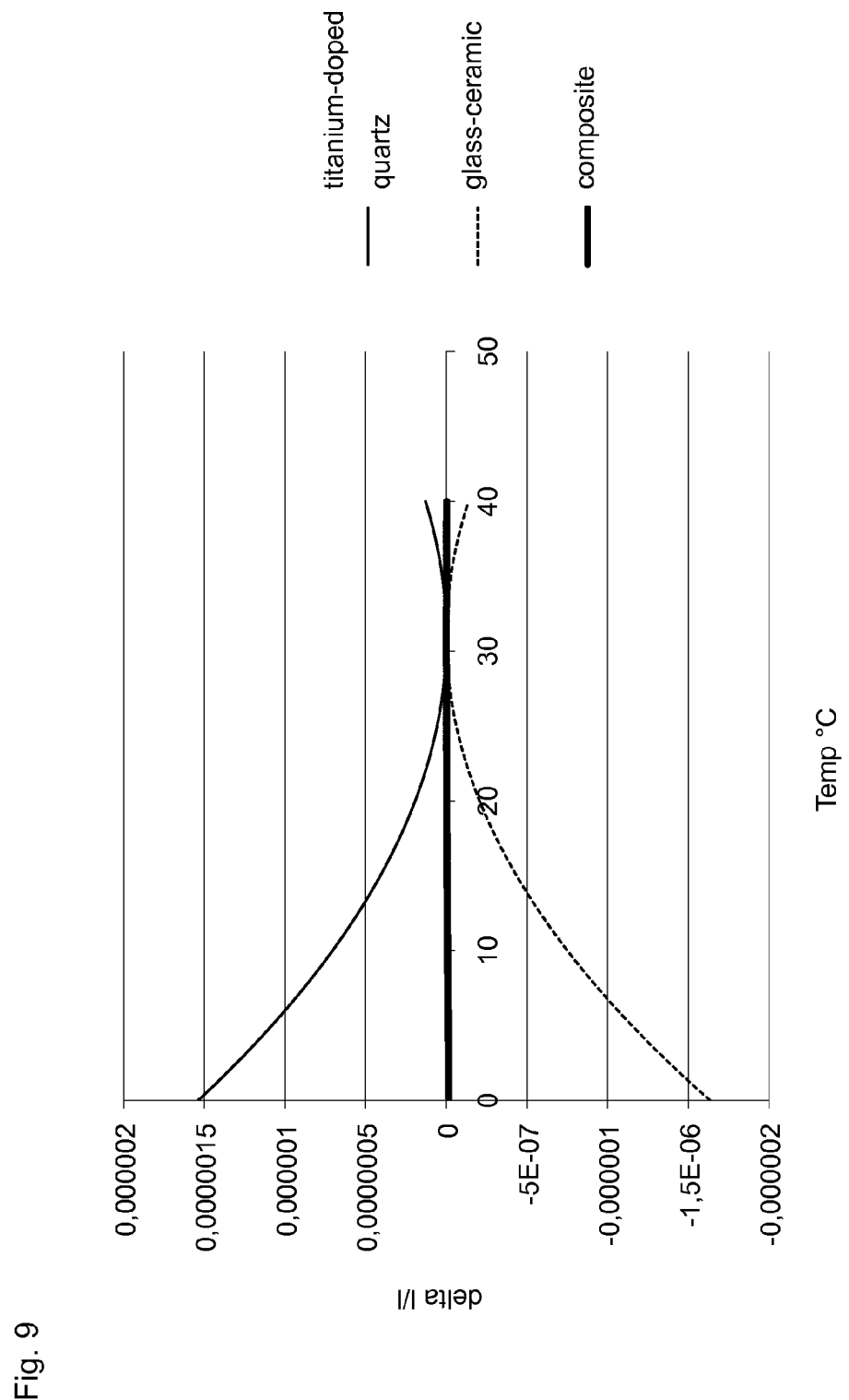
FIG. 9 is a graph of the gradient of thermal expansion as a function of temperature for two different substrate materials and for a substrate composite material manufactured therefrom.

FIG. 9 shows an example of a composite material in which a titanium-doped quartz glass having a zero-crossing temperature of 31° C. was mixed with a glass-ceramic material having a zero-crossing temperature of 31° C. in such a manner that 100 parts titanium-doped quartz glass were combined with 95 parts glass-ceramic material. While the titanium-doped quartz glass has a thermal longitudinal expansion of 576 ppb across the temperature range from 10° C. to 40° C., and the glass-ceramic material of 612.4 ppb, the composite material only has a thermal longitudinal expansion of 5.4 ppb. Across a temperature range between 20° C. and 35° C., the titanium-doped quartz glass has a relative thermal expansion of 168 ppb, the glass-ceramic material of 232.9 ppb, and the composite material of only 1.575 ppb.

Since the properties of the glass-ceramic material can be destroyed by uncontrolled heating, the material made of glass-ceramic material and titanium-doped quartz glass is preferably sintered in such a way that the temperature curves, the cooling curve in particular, correspond to the manufacturing process of the glass-ceramic. If larger-sized pieces of the individual materials can be used to compose a substrate, the individual material pieces can also be sawed and polished and slightly heated, after contacting, or the contact surfaces can be treated with an alkaline solution in order to fixedly connect the individual material pieces with each other. Subsequently, the substrate is given its final shape, a polishing layer is applied, as the case may be, and this is polished to achieve as little roughness on the surface as possible which, in further processing to an EUV mirror, is provided with a reflective layer, for example a multilayer system.

The acceptable expansion of individual material pieces can be estimated in view of the framework conditions, such as minimum and maximum temperature, to which the substrate is to be exposed, and the resulting thermal longitudinal expansions, and the acceptable resulting roughness. Let it be assumed that the working temperature range is 10K, which would correspond to a raw state at 22° C. and an operating temperature of 32° C. It is also assumed that a relative thermal expansion of 100 ppb is reached across this temperature range and a surface deformation of 50 pm is still acceptable. Then, in a first approximation, the maximum allowable particle size can be estimated as a quotient of the acceptable surface deformation 50 pm and the relative thermal longitudinal expansion of 100 ppb, as 0.5 mm. In this case, the materials would be pounded or even ground, and subsequently sintered.

It should be noted that it is also possible to produce substrates suitable as a substrate for mirrors for EUV lithography by mixing three, four or more materials.

A further approach to reduce the influence of inhomogeneous zero-crossing temperatures within a material blank is shown with reference to FIGS. 10 to 14. This approach is particularly suitable for material blanks having an essentially periodic distribution of the zero-crossing temperature. This is the case, for example, with titanium-doped quartz glass, which can be manufactured in a cost-effective manner in the direct deposition method. It is applicable, in particular, if the resulting material blank is rotated relative to the deposition device during the deposition process. So-called boules are formed which, in a first approximation, have a cylinder shape and wherein, in a first approximation, it is assumed that the zero-crossing temperature distribution has radial symmetry.

Figure 10:
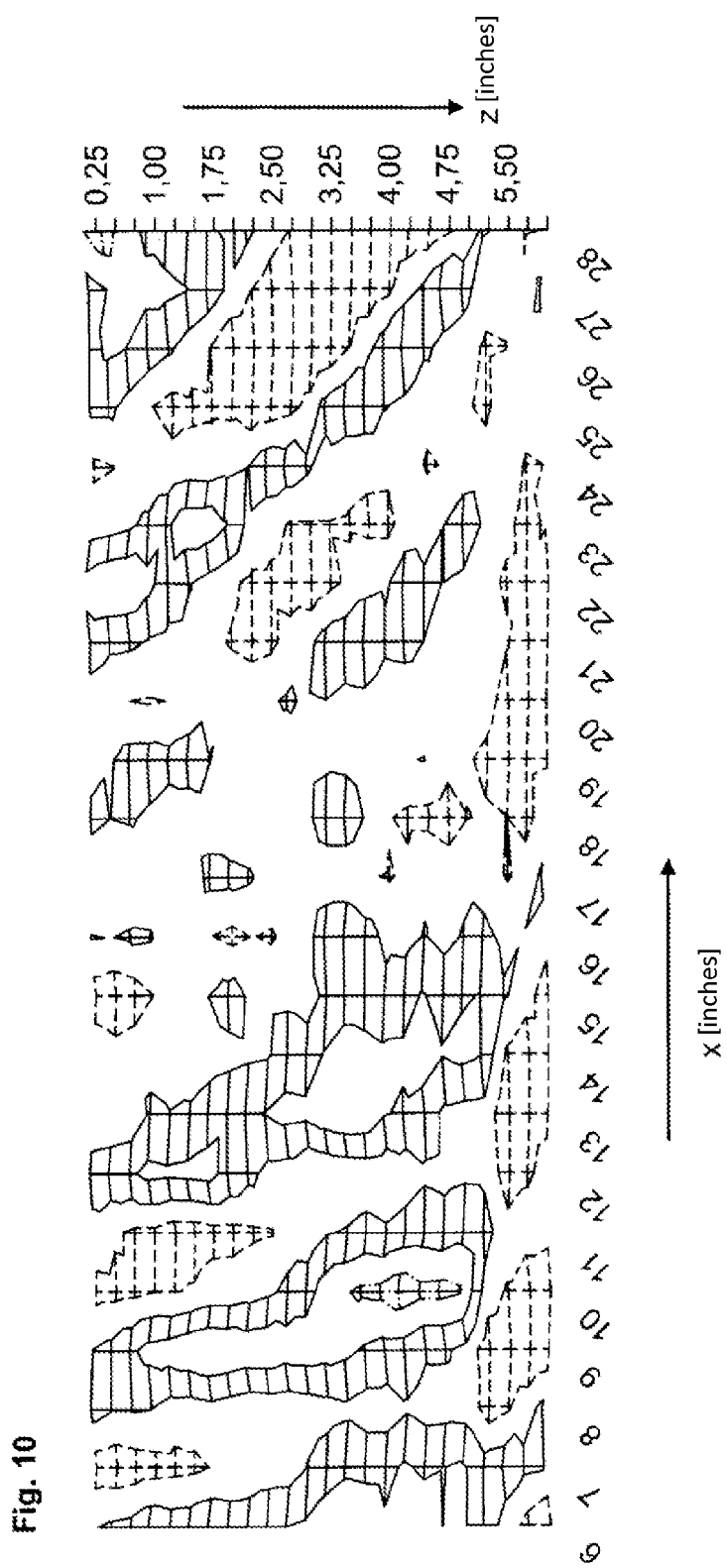
FIG. 10 shows the distribution of different zero-crossing temperatures in a material blank.

FIG. 10 shows an example of the zero-crossing temperature distribution in the interior of a titanium-doped quartz glass blank in the form of a boule. For demonstration, a sectional view in the radial x direction and in z direction parallel to the rotation axis during deposition is shown. The dimensions are indicated in inches. The center point of the boule is on the left side of the diagram in FIG. 9. The distribution of the zero-crossing temperature was measured with the aid of ultrasonic waves starting only at a distance of 6 inches from the center of the boule. The thickness of the boule slightly exceeds 5.5 inches, wherein layers positioned at about 5.5 inches were first deposited, and the layers positioned at 0.25 inches were deposited last. The measured zero-crossing temperature distribution is shown as a contour line graph. The values vary by about 2° C. between the individual framed areas, which corresponds to an overall temperature difference of about 8° C. Particularly low zero-crossing temperature ranges are shown with black, slightly dashed lines. Moderate temperature ranges are shown in medium grey, and a few areas having a particularly high temperature, are shown in light grey, such as in the area of x=10 inches and z=4 inches.

The distribution of the zero-crossing temperatures, in a first approximation, has a periodic wave form, wherein the period is about 4 to 5 inches. While in the past usually slices were cut from the substrate material blank without taking the actual distribution of the zero-crossing temperature into consideration, in order to lose as little material as possible, it is now suggested to choose the orientation of the mirror surface within the blank in such a manner that the period of the zero-crossing temperature distribution is as large as possible on the surface of the substrate. As a second boundary condition, advantageously, the desired average zero-crossing temperature is taken into consideration to decide whether the substrate surface is chosen along a valley or a hill or in between. Furthermore, the surface can be chosen such that the zero-crossing temperature decreases continuously as the depth increases below as large a proportion as possible of the used mirror surface, with respect to the zero-crossing temperature at the surface.

Figure 11:
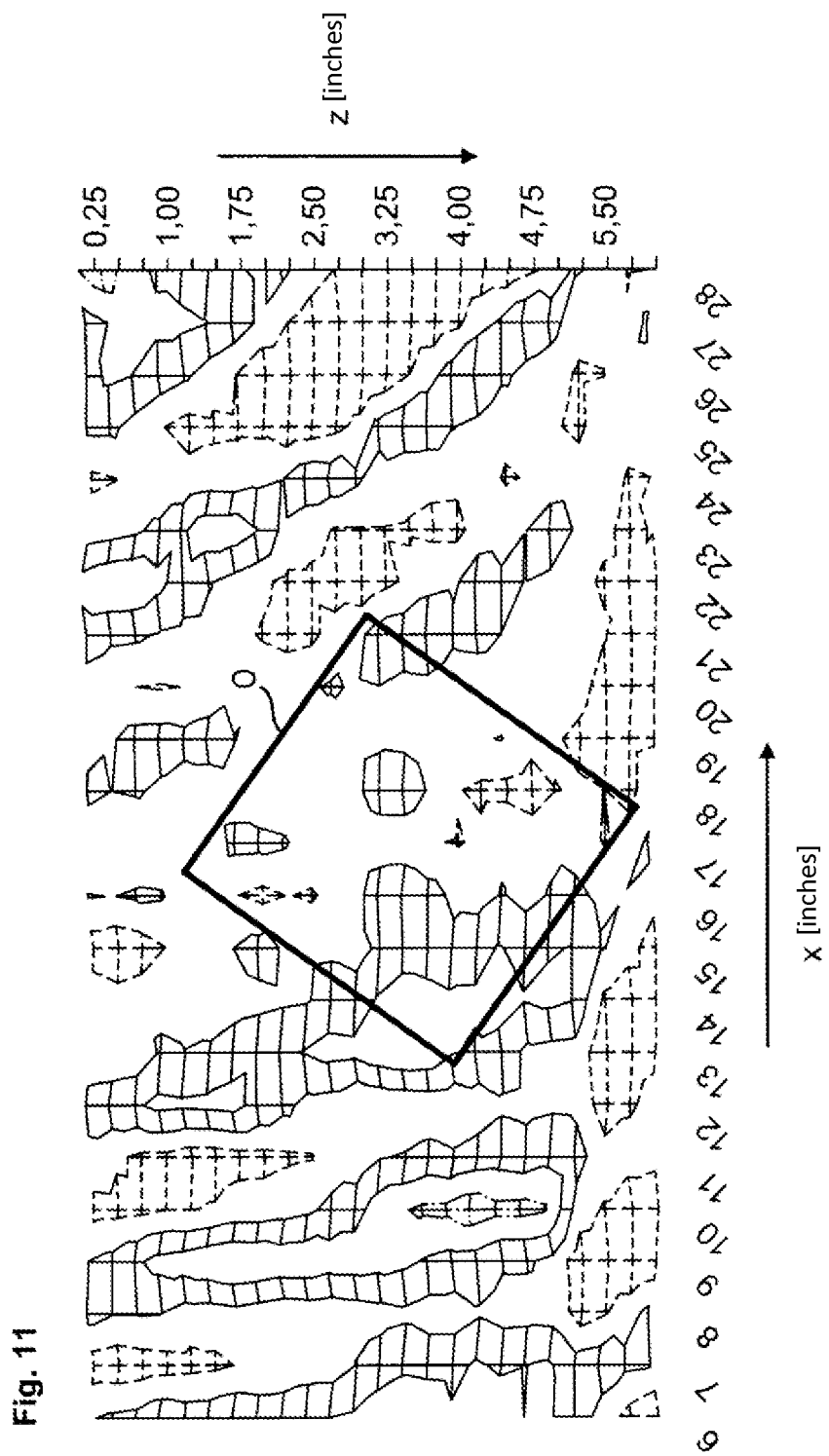
FIG. 11 shows a possibility of cutting a substrate from the material blank shown in FIG. 9.

FIG. 11 shows an example of how a substrate, here shown as a rectangle, could be cut from the material blank. The substrate is oriented in such a manner that the period length of the distribution of the zero-crossing temperature is larger on its surface O than in the direction normal to the surface. In the direction normal to the surface and thus in the direction of the heat introduction, the minima and maxima of the distribution lie at short distances from each other which contributes to the deformations on the mirror surface being partially compensated and thus minimized. At the same time, the deformations across the plane of the mirror surface are as large as possible due to the long lateral distances of the minima and maxima, thus inducing rather long-wave fitting errors due to the inhomogeneous thermal expansion. However, these are easy to correct with the aid of suitable manipulators.

Figure 12A:
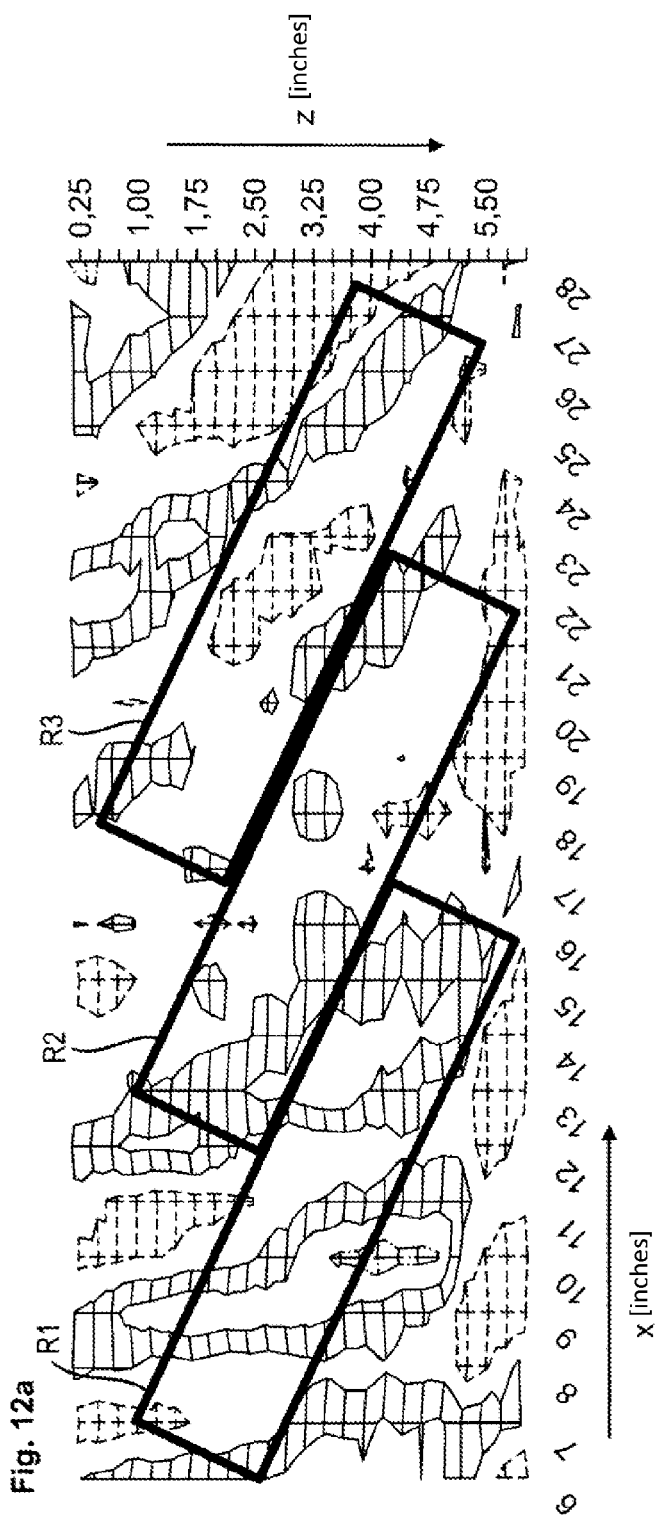
FIGS. 12*a,b* show a second possibility to cut a substrate from the material blank of FIG. 9.
Figure 12B:
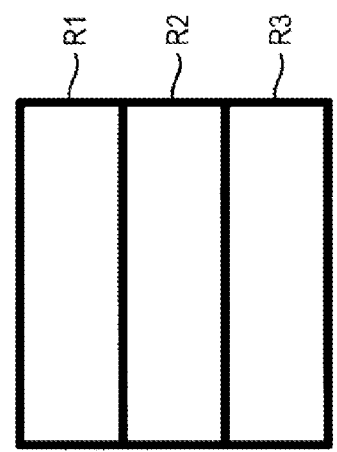
Figure 13A:
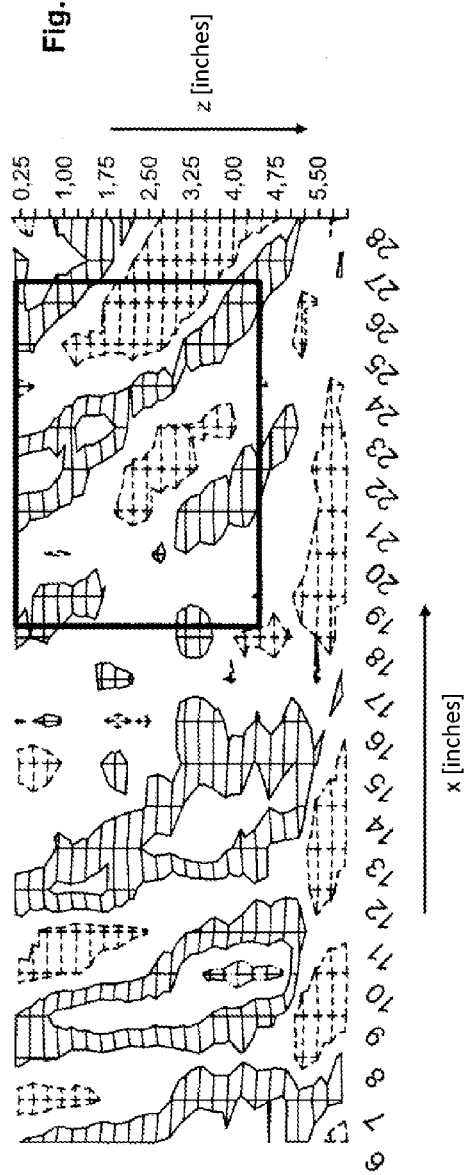
FIGS. 13a,b show a third possibility to obtain a substrate from the material blank of FIG. 9.
Figure 13B:
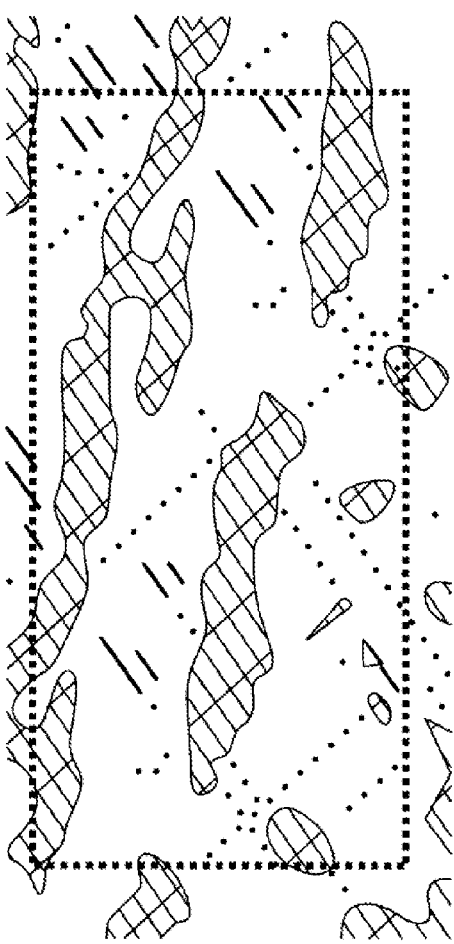

Depending on the size of the material blank and the desired size of the resulting substrate, the substrate can also be composed of a plurality of material sections individually cut from the material blank. An example of such a substrate is shown in FIGS. 12a,b. In the example shown here, all three material sections, shown as rectangles R1, R2, R3, have been cut from the material blank in such a manner that the period length in the plane of their respective surfaces is longer than in the direction normal to their respective surfaces. Thus, the substrate composed of the rectangles R1, R2, R3 (cf. FIG. 12b) also fulfills this favorable condition with respect to a thermal longitudinal expansion which is as small as possible.

Depending on the preexisting distribution of the zero-crossing temperature and the dimensions of the desired substrate, there is also the possibility to influence the distribution by deforming the material blank prior to cutting out the actual substrate in such a manner that the period length in the plane of the surface is longer than in the direction normal to the surface for the cut-out substrate. In the example shown in FIGS. 13a,b, the material blank was first sheared in the x direction, for example. This results in the zero-crossing distribution shown in FIG. 13b, from which subsequently the substrate is cut along the dashed lines. The period length in the then resulting surface of the substrate was increased by the shearing process and, at the same time, the period length in the direction normal to the surface was shortened in comparison to the initial material blank (cf. FIG. 13a).

It should be noted that the substrate can be cut out in such a manner from material blanks having distributions of the zero-crossing temperature with particularly short period lengths across the material blank, that the period length in the plane of the surface of the substrate is as small as possible. In this case it is utilized that the contributions of the near-surface areas with different expansion behavior compensate each other effectively at exceedingly short distances in the plane of the mirror surface.

Figure 14:
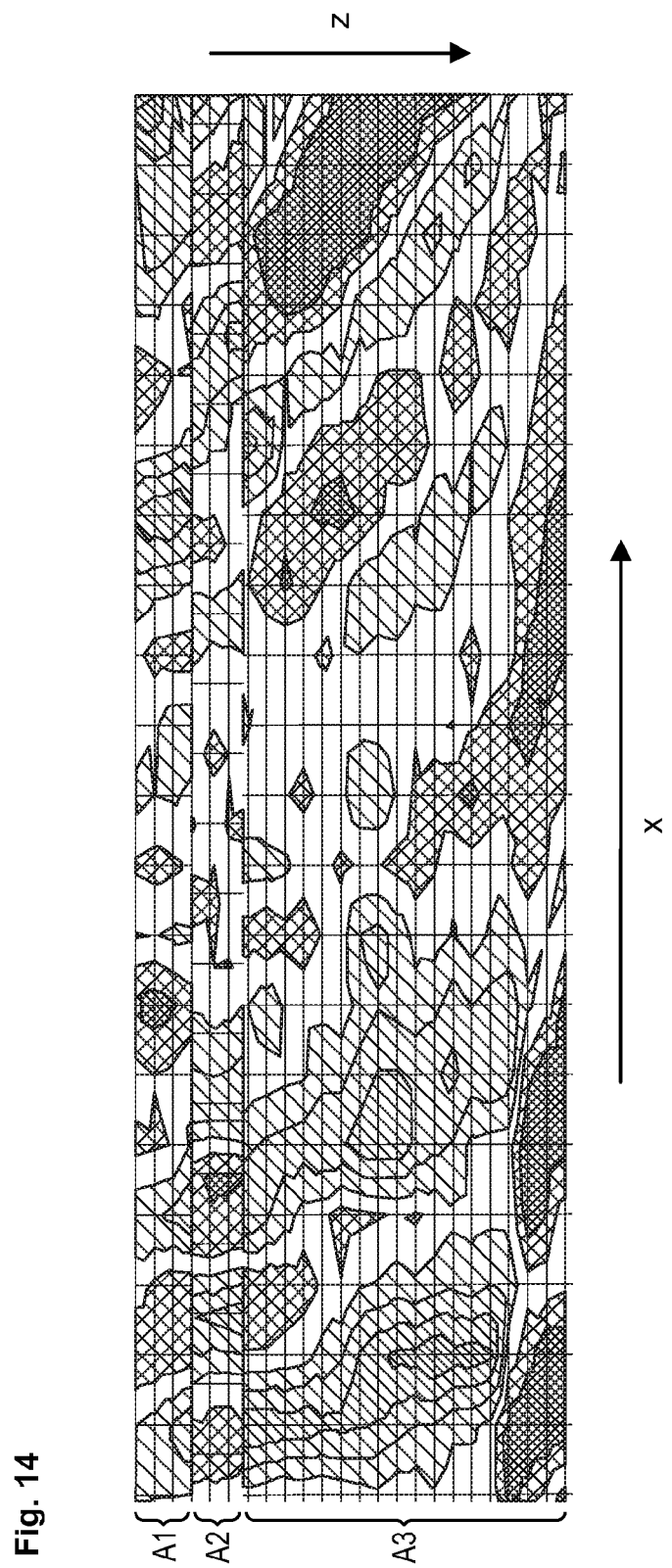
FIG. 14 shows a further embodiment of the substrate for EUV mirrors.

A further approach to avoid the negative influences of heat expansion, in particular with substrate materials having a periodic zero-crossing temperature distribution, is shown in FIG. 14. Here, the substrate material has been subdivided into three sections A1, A2, A3, and the sections A1, A2, A3 have been offset with respect to each other in such a way that one section A1, A2 has been offset by half a period length relative to each underlying section A2, A3. In this manner, while keeping a period across the surface plane of the substrate as large as possible, the period normal to the surface is substantially shortened to achieve better compensation of the individual areas having different zero-crossing temperatures relative to each other. While in the example shown here, three sections have been used, the effect can already be achieved with two sections, or it can be further optimized with four, five, six or more sections.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A substrate for an extreme-ultraviolet (EUV) lithography mirror having a mean relative thermal longitudinal expansion of no more than 10 ppb across a temperature interval $\Delta T$ of 15° C. and a zero-crossing temperature in the range between 20° C. and 40° C.

2. The substrate according to claim 1, having a mean relative thermal longitudinal expansion of no more than 10 ppb across a temperature interval $\Delta T$ of 30° C.

3. The substrate according to claim 1, having a mean relative thermal longitudinal expansion of no more than 5 ppb across a temperature interval $\Delta T$ of 15° C.

4. The substrate according to claim 1, having a zero-crossing temperature in the range between 28° C. and 33° C.

5. A substrate for an EUV lithography mirror, having a volume of at least 3000 cm³, wherein a zero-crossing temperature averaged across any given, partial volume of up to 10 cm³ varies by less than 2° C.

6. The substrate according to claim 5, having a mean relative thermal longitudinal expansion of no more than 10 ppb across a temperature interval $\Delta T$ of 15° C.

7. The substrate according to claim 5, having a mean relative thermal longitudinal expansion of no more than 10 ppb across a temperature interval $\Delta T$ of 30° C.

8. The substrate according to claim 5, having a mean relative thermal longitudinal expansion of no more than 5 ppb across a temperature interval $\Delta T$ of 15° C.

9. The substrate according to claim 5, having an averaged zero-crossing temperature in the range between 20° C. and 40° C.

10. The substrate according to claim 5, having an averaged zero-crossing temperature in the range between 28° C. and 33° C.

11. The substrate according to claim 1, defining a surface and having an inhomogeneous distribution of a mean thermal expansion coefficient in a direction normal to the surface of the substrate.

12. A substrate for an EUV lithography minor, defining a surface and having an inhomogeneous distribution of a mean thermal expansion coefficient in a direction normal to the surface of the substrate, wherein a zero-crossing temperature in the direction normal to the surface of the substrate decreases with increasing distance from the surface.

13. A substrate for an EUV lithography minor, defining a surface and having an inhomogeneous distribution of a mean thermal expansion coefficient in a direction normal to the surface of the substrate, wherein at least one material section, having an extension of at least 1 cm, has a higher zero-crossing temperature than material surrounding the material section.

14. The substrate according to claim 13, wherein the material section having the higher zero-crossing temperature is arranged on the surface.

15. The substrate according to claim 13, comprising:
a first material section extending across an entirety of the surface of the substrate and having a given zero-crossing temperature,
a second material section having a zero-crossing temperature lower than the given zero-crossing temperature and which extends under the entirety of the surface of the substrate, and
a heating device.

16. A substrate for an EUV lithography minor defining a plane of a surface and having an essentially periodic zero-crossing-temperature distribution, wherein the period length in the plane of the surface of the substrate is longer than in a direction normal to the surface.

17. A substrate for an EUV lithography minor, comprising at least two sections arranged one on top of the other, wherein both sections have an essentially periodic zero-crossing-temperature distribution, and wherein the distribution of the thermal expansion coefficient of the one section is shifted by half a period length relative to the distribution of the zero-crossing temperature of the other section.

18. The substrate according to claim 1, defining a substrate surface and comprising a polishing layer on the surface.

19. A mirror for EUV lithography, comprising a substrate as claimed in claim 1, and a reflective layer.

* * * * *

UNITED STATES PATENT AND TRADEMARK OFFICE
CERTIFICATE OF CORRECTION

PATENT NO.         : 8,870,396 B2                                   Page 1 of 1
APPLICATION NO.    : 13/667862
DATED              : October 28, 2014
INVENTOR(S)        : Julian Kaller et al.

Figure 17:
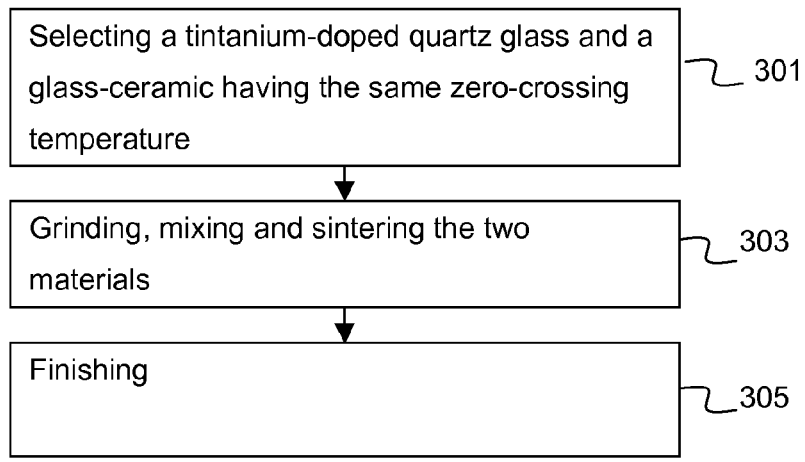
FIG. 17 shows a third embodiment of a method for the manufacture of substrates for EUV mirrors.

It is certified that error appears in the above-identified patent and that said Letters Patent is hereby corrected as shown below:

In the Drawings:
Drawing Sheet 12 of 12; Fig. 17; Reference Numeral 301; change "tintanium" to -- titanium --.

In the Specification:
Column 2; Line 35; change "a a" to -- a --.

In the Claims:
Column 14; Line 8; In Claim 5 change "given," to -- given --.

Column 14; Line 26; In Claim 12 change "minor" to -- mirror --.

Column 14; Line 32; In Claim 13 change "minor" to -- mirror --.

Column 14; Line 50; In Claim 16 change "minor" to -- mirror --.

Column 14; Line 55; In Claim 17 change "minor" to -- mirror --.

Signed and Sealed this
Fourteenth Day of July, 2015

Michelle K. Lee
*Director of the United States Patent and Trademark Office*